United States Patent
Liu et al.

(10) Patent No.: US 10,651,040 B2
(45) Date of Patent: May 12, 2020

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Tzu-Hao Liu, Taichung (TW); Yi-Wei Chen, Taichung (TW); Tsun-Min Cheng, Changhua County (TW); Kai-Jiun Chang, Taoyuan (TW); Chia-Chen Wu, Nantou County (TW); Yi-An Huang, New Taipei (TW); Po-Chih Wu, Tainan (TW); Pin-Hong Chen, Tainan (TW); Chun-Chieh Chiu, Keelung (TW); Tzu-Chieh Chen, Pingtung County (TW); Chih-Chien Liu, Taipei (TW); Chih-Chieh Tsai, Kaohsiung (TW); Ji-Min Lin, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/986,797

(22) Filed: May 22, 2018

(65) Prior Publication Data
US 2019/0318933 A1    Oct. 17, 2019

(30) Foreign Application Priority Data
Apr. 17, 2018 (CN) .......................... 2018 1 0342006

(51) Int. Cl.
*H01L 21/28* (2006.01)
*G11C 11/4097* (2006.01)
*H01L 27/108* (2006.01)

(52) U.S. Cl.
CPC .... *H01L 21/28088* (2013.01); *G11C 11/4097* (2013.01); *H01L 27/10844* (2013.01)

(58) Field of Classification Search
CPC ... H01L 33/62; H01L 33/486; H01L 27/3244; H01L 33/56; C09K 11/06
USPC ....................................................... 257/288
See application file for complete search history.

(56) References Cited

U.S. PATENT DOCUMENTS

| | | | |
|---|---|---|---|
| 6,093,645 A | 7/2000 | Ameen et al. | |
| 7,153,773 B2 | 12/2006 | Otsuki et al. | |
| 7,833,906 B2 | 11/2010 | Knapp et al. | |
| 2005/0006722 A1* | 1/2005 | Zonca | H01L 45/06 257/536 |
| 2014/0363964 A1* | 12/2014 | Breil | H01L 29/42372 438/595 |

* cited by examiner

*Primary Examiner* — Andy Huynh
(74) *Attorney, Agent, or Firm* — Winston Hsu

(57) ABSTRACT

A method for fabricating semiconductor device includes the steps of: forming a titanium nitride (TiN) layer on a silicon layer; performing a first treatment process by reacting the TiN layer with dichlorosilane (DCS) to form a titanium silicon nitride (TiSiN) layer; forming a conductive layer on the TiSiN layer; and patterning the conductive layer, the metal silicon nitride layer, and the silicon layer to form a gate structure.

14 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating bit line structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a titanium nitride (TiN) layer on a silicon layer; performing a first treatment process by reacting the TiN layer with dichlorosilane (DCS) to form a titanium silicon nitride (TiSiN) layer; forming a conductive layer on the TiSiN layer; and patterning the conductive layer, the metal silicon nitride layer, and the silicon layer to form a gate structure.

According to another aspect of the present invention, a method for fabricating semiconductor device includes the steps of: forming a titanium silicon nitride (TiSiN) layer on a silicon layer; performing a first treatment process by reacting the TiSiN layer with ammonia ($NH_3$) to form a nitrogen-rich layer; forming a conductive layer on the nitrogen-rich layer; and patterning the conductive layer, the nitrogen-rich layer, and the silicon layer to form a gate structure.

According to yet another aspect of the present invention, a semiconductor device includes: a gate structure on a substrate, wherein the gate structure comprises: a silicon layer on the substrate; a titanium nitride (TiN) layer on the silicon layer; a titanium silicon nitride (TiSiN) layer on the TiN layer; and a conductive layer on the TiSiN layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
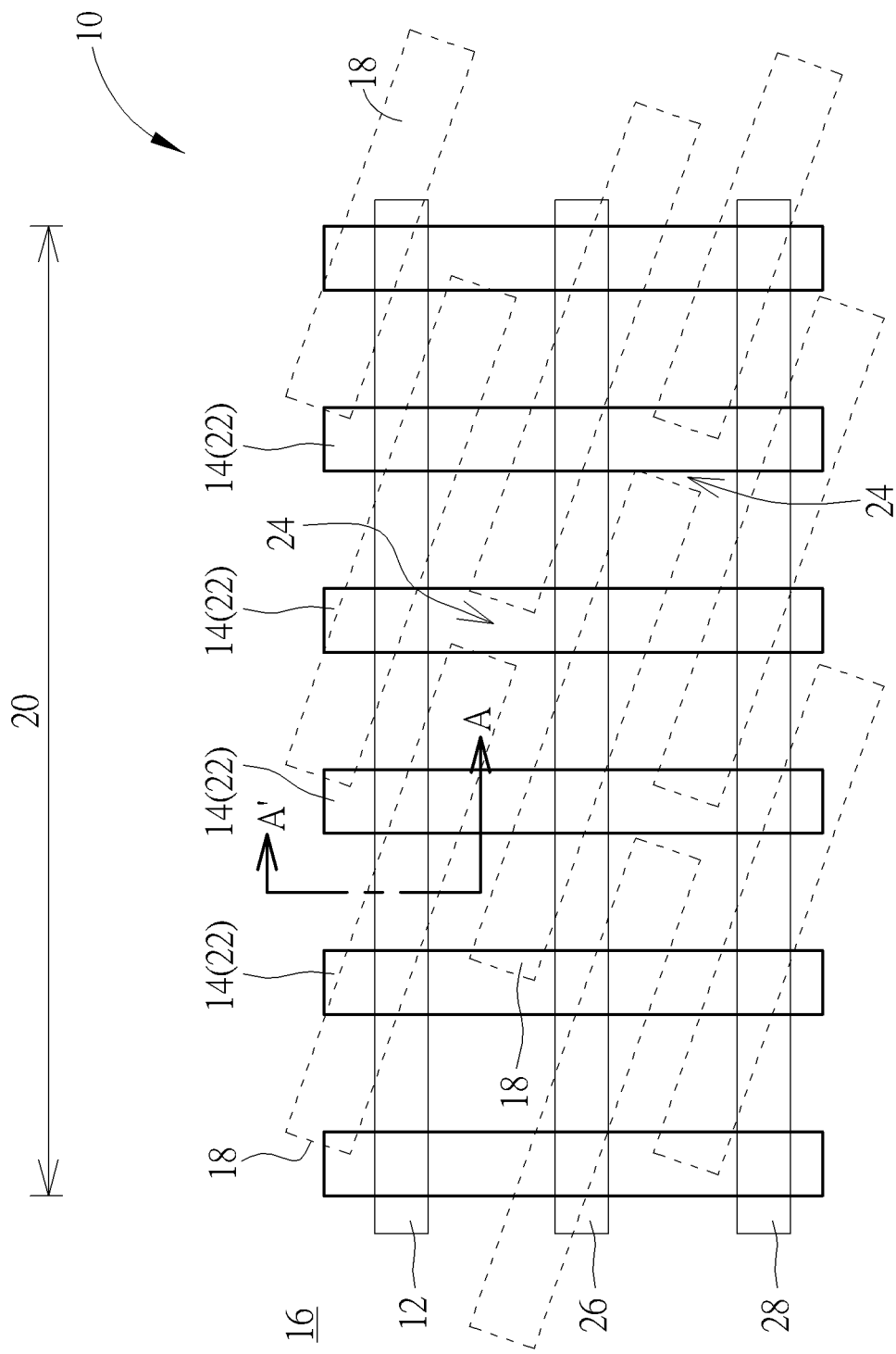
FIG. 1 illustrates a top-view diagram of a DRAM device according to an embodiment of the present invention.

Referring to FIGS. 1-5, FIGS. 1-5 illustrate a method for fabricating a DRAM device according to an embodiment of the present invention, in which FIG. 1 illustrates a top-view diagram for fabricating a DRAM device and FIGS. 2-5 illustrate cross-sectional views of a method for fabricating bit line of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines or bit line structures 12, 26, 28 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit line structures 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Specifically, the gates 22 are disposed extending along a second direction such as Y-direction, in which the second direction crosses the first direction at an angle less than 90 degrees.

The bit line structures 12, 26, 28 are disposed on the substrate 16 parallel to each other and extending along a third direction such as X-direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
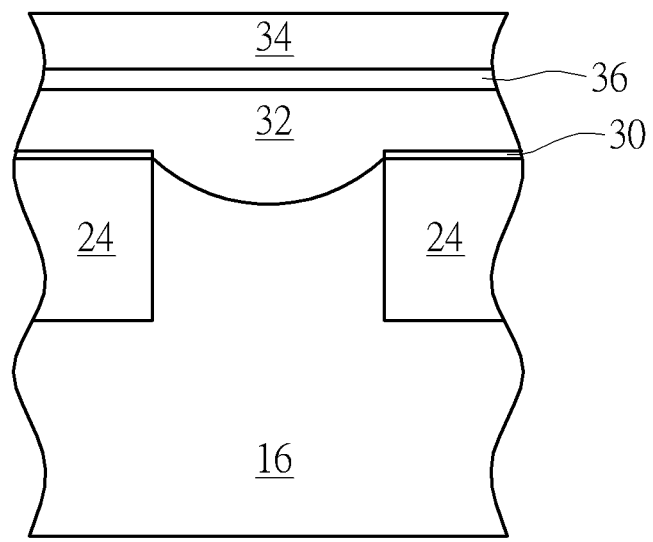
FIGS. 2-5 illustrate cross-sectional views of a method for fabricating bit line of the DRAM device along the sectional line AA' of FIG. 1.

The fabrication process conducted after the formation of word lines 14 (or also referred to as buried word lines) and STI 24 is explained below. First as shown in FIG. 2, a STI 24 is formed in the substrate 16 to define the active regions 18 and word lines (not shown) are formed in part of the STI 24 and the substrate 16, and an insulating layer or more specifically a gate insulating layer 30 is formed on the surface of the STI 24 and the substrate 16. Preferably, the gate insulating layer 30 is serving as a gate insulating layer on the periphery region while serving as a mask layer on the memory region 20 in this embodiment. Next, a photo-etching process is conducted by using patterned mask (not shown) as mask to remove part of the gate insulating layer 30 between the STI 24 and part of the substrate 16 to form a recess (not shown) and then form a semiconductor layer or more specifically a silicon layer 32 in the recess and on the surface of the gate insulating layer 30, in which part of the silicon layer 32 directly contacting the substrate 16 preferably serves as a bit line contact (BLC) after a patterning process is conducted afterwards.

In this embodiment, the gate insulating layer 30 is preferably a single-layered structure made of silicon oxide. Nevertheless, according to an embodiment of the present invention, the gate insulating layer 30 could also be a multi-layered structure made of a silicon oxide layer, a silicon nitride, layer, and another silicon oxide layer, which is also within the scope of the present invention. Next, the silicon layer 32 disposed on the gate insulating layer 30 preferably includes amorphous silicon, but not limited thereto.

Next, a pre-clean process could be conducted to remove impurities on the surface of the silicon layer 32, and a chemical vapor deposition (CVD) process or atomic layer deposition (ALD) process is conducted to form a titanium (Ti) layer 34 on the surface of the silicon layer 32. Preferably, an in-situ thermal treatment process could be conducted to form a metal silicide 36 between the Ti layer 34 and the silicon layer 32, in which the metal silicide 36 preferably includes titanium silicide (TiSi).

Figure 3:
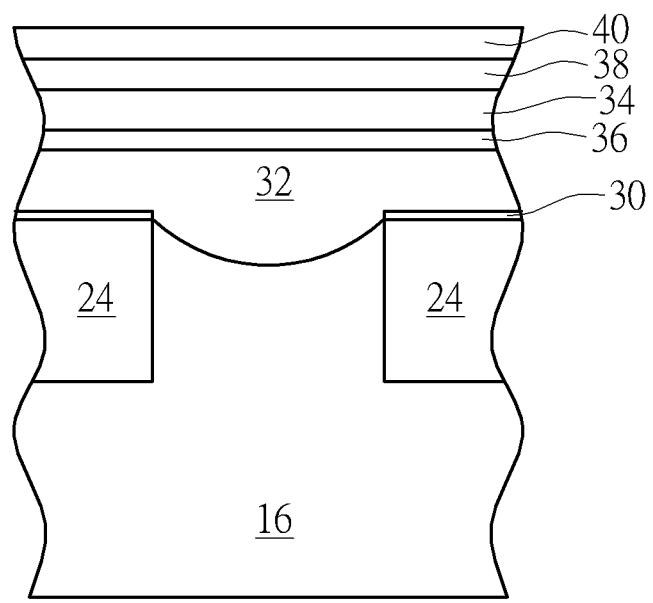

Next, as shown in FIG. 3, a treatment process is conducted by reacting the Ti layer 34 with ammonia ($NH_3$) to form a titanium nitride (TiN) layer 38 on the Ti layer 34, and then another treatment process is conducted to react the TiN layer 38 with dichlorosilane (DCS) to form a titanium silicon nitride (TiSiN) layer 40. It should be noted that as the Ti layer 34 is reacted with $NH_3$ to form the TiN layer 38, only part of the Ti layer 34 is transformed into the TiN layer 38 so that some of the Ti layer 34 is still remained between the metal silicide 36 and the TiN layer 38 after the TiN layer 38 is formed. Similarly, as the TiN layer 38 is reacted with DCS to form the TiSiN layer 40, only part of the TiN layer 38 is transformed into the TiSiN layer 40 so that some of the TiN layer 38 is still remained between the Ti layer 34 and the TiSiN layer 40 after the TiSiN layer 40 is formed.

In this embodiment, the temperature of the in-situ thermal treatment process conducted to form the metal silicide 36 is approximately 600° C. and the metal silicide 36, Ti layer 34, TiN layer 38, and TiSiN layer 40 from bottom to top could share equal or different thicknesses. For instance, according to an embodiment of the present invention, the thickness of the metal silicide 36 in the final structure is preferably less than the thickness of each of the TiN layer 38, the TiSiN layer 40, and the Ti layer 34, the thickness of the TiN layer 38 is preferably equal to the thickness of the TiSiN layer 40, and the thickness of each of the TiN layer 38 and TiSiN layer 40 is less than the thickness of the Ti layer 34.

Specifically, the thickness of the metal silicide 36 is preferably less than 5 Angstroms and greater than 0 Angstroms, the thickness of the Ti layer 34 is between 10 Angstroms to 15 Angstroms, the thickness of the TiN layer 38 is between 5 Angstroms to 10 Angstroms, and the thickness of the TiSiN layer 40 is also between 5 Angstroms to 10 Angstroms. Overall, the combined or total thickness of the TiN layer 38 and the TiSiN layer 40 is preferably between 30 Angstroms to 40 Angstroms.

Figure 4:
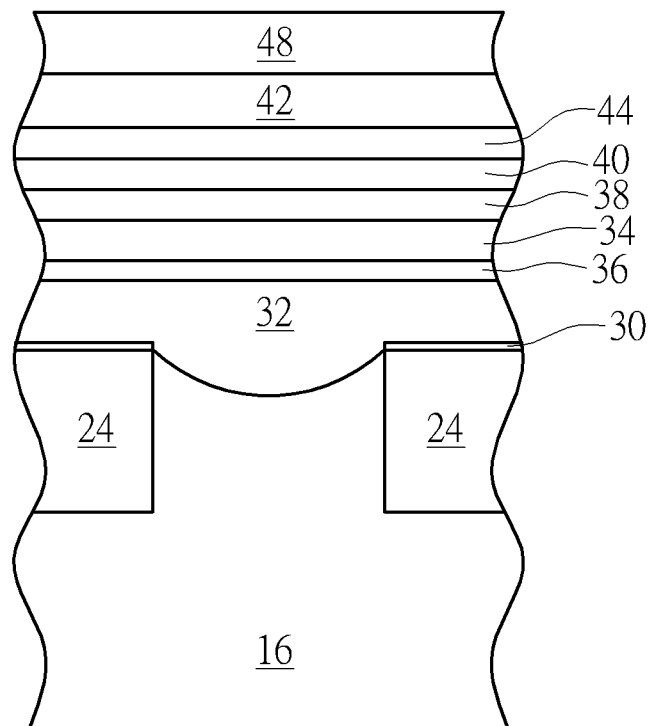

Next, as shown in FIG. 4, a conductive layer 42 and a cap layer 48 could be sequentially formed on the surface of the TiSiN layer 40, in which the conductive layer 42 preferably includes tungsten and the cap layer 48 preferably includes silicon nitride. It should be noted that an optional thermal treatment process (such as an anneal process) could be conducted during the formation of the conductive layer 42 so that an additional metal silicide 44 could be formed between the TiSiN layer 40 and the conductive layer 42, in which the metal silicide 44 preferably includes tungsten silicide.

Figure 5:
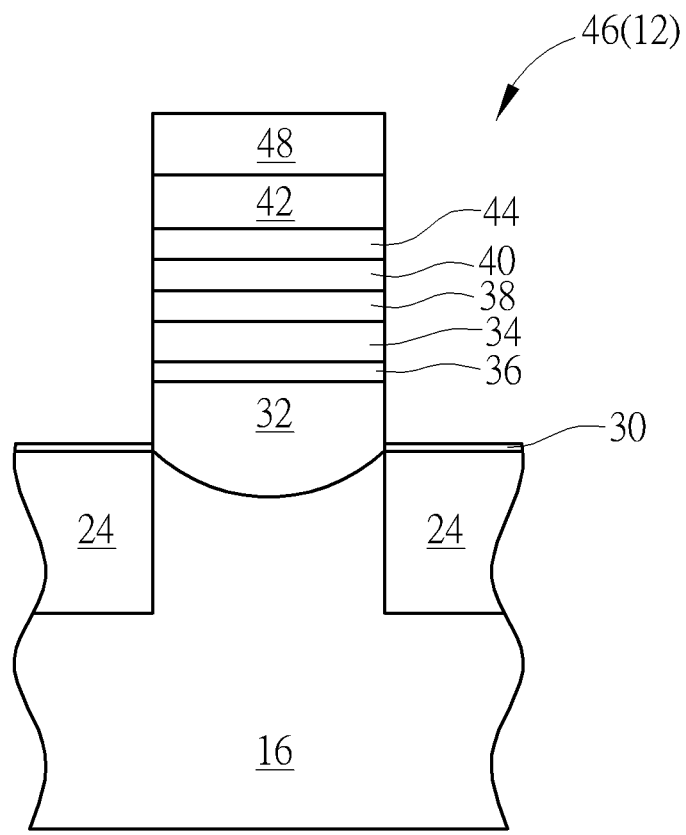

Next, as shown in FIG. 5, a pattern transfer or photo-etching process could be conducted by first forming a patterned mask (not shown) on the cap layer 48, and then using the patterned mask as mask to remove part of the cap layer 48, part of the conductive layer 42, part of the metal silicide 44, part of the TiSiN layer 40, part of the TiN layer 38, part of the Ti layer 34, part of the metal silicide 36, and part of the silicon layer 32 to form a gate structure 46 on the substrate 16. Specifically, the gate structure 46 formed at this stage preferably serves as a bit line structure 12 for the DRAM device while part of the silicon layer 32 directly contacting the substrate 16 is serving as a bit line contact. Next, storage node contacts could be formed adjacent to two sides of the bit line structure 12 to electrically connect source/drain regions and capacitors formed in the later process. Since the fabrication of storage node contacts and capacitors is well known to those skilled in the art, the details of which are not explained herein for the sake of brevity.

Figure 6:
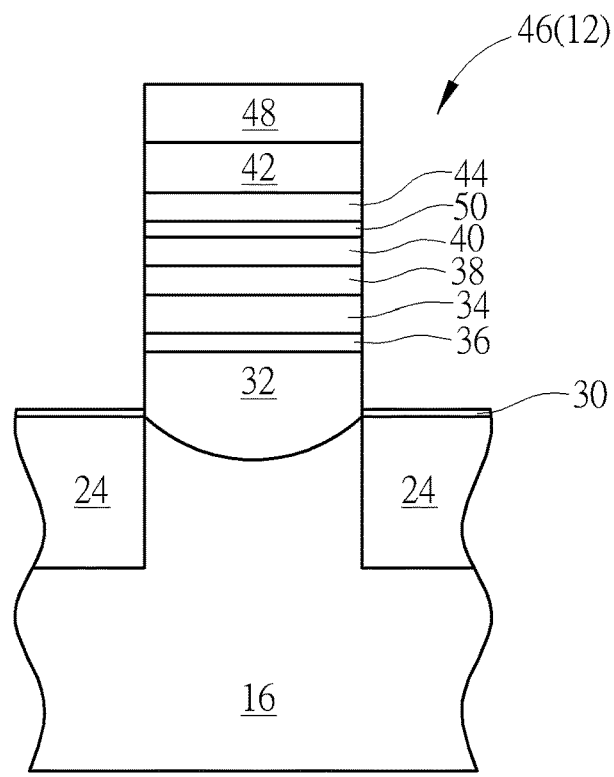
FIG. 6 illustrates a structural view of a DRAM device according to an embodiment of the present invention.

Referring to FIG. 6, FIG. 6 illustrates a method for fabricating a semiconductor device according to an embodiment of the present invention. As shown in FIG. 6, it would also be desirable to conduct an additional treatment process to react part of the TiSiN layer 40 with ammonia ($NH_3$) to form a nitrogen-rich layer 50 on the surface of the TiSiN layer 40, in which the nitrogen-rich layer 50 essentially is also composed of TiSiN. In other words, two layers of TiSiN layers having different nitrogen concentrations could be formed on top of the TiN layer 38, in which the concentration of nitrogen in the TiSiN layer 40 on the bottom is preferably less than the concentration of nitrogen in the TiSiN layer (or nitrogen-rich layer 50) on the top.

Next, it would be desirable to follow the aforementioned process to form another metal silicide 44, a conductive layer 42, and a cap layer 48 on the nitrogen-rich layer 50, and then patterning the cap layer 48, the conductive layer 42, the metal silicide 44, the nitrogen rich layer 50, the TiSiN layer 40, the TiN layer 38, the Ti layer 34, the metal silicide 36, and the silicon layer 32 to form a gate structure 46 on the substrate 16 serving as bit line structure 12. Next, storage node contacts could be formed adjacent to two side of the bit line structure 12 to electrically connect source/drain regions and capacitors formed in the later process. Since the fabrication of storage node contacts and capacitors is well known to those skilled in the art, the details of which are not explained herein for the sake of brevity.

Figure 7:
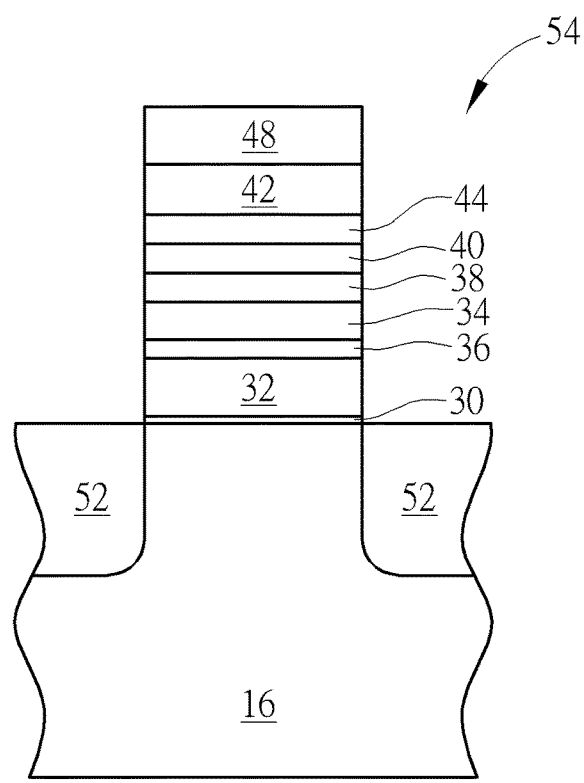
FIG. 7 illustrates a structural view of a gate structure formed on the periphery region according to an embodiment of the present invention.

Referring to FIG. 7, FIG. 7 illustrates a structural view of a semiconductor device according to an embodiment of the present invention. As shown in FIG. 7, it would be desirable to form the bit line structure 12 shown in FIG. 5 on the memory region 20 and at the same time form another gate structure 54 on the substrate 16 on the periphery region, in which the gate structure 54 preferably includes a silicon layer 32 disposed on the substrate 16, a gate insulating layer 30 disposed between the silicon layer 32 and the substrate 16, a Ti layer 34 disposed on the silicon layer 32, a metal silicide 36 disposed between the Ti layer 34 and the silicon layer 32, a TiN layer 38 disposed on the Ti layer 34, a TiSiN layer 40 disposed on the TiN layer 38, a conductive layer 42 disposed on the TiSiN layer 40, a metal silicide 44 disposed between the TiSiN layer 40 and the conductive layer 42, and a cap layer 48 disposed on the conductive layer 42. In contrast to having STI 24 disposed adjacent to two sides of the gate structure 46 as shown in FIG. 5, a source/drain region 52 is disposed in the substrate 16 adjacent to two sides of the gate structure 54 on the periphery region, in which the source/drain region 52 could include n-type or p-type dopants depending on the type of transistor being fabricated.

Figure 8:
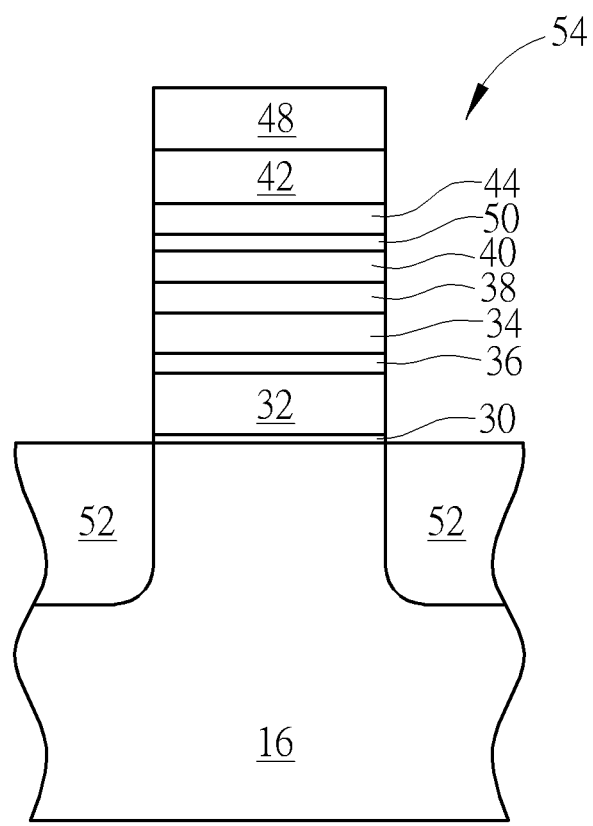
FIG. 8 illustrates a structural view of a gate structure formed on the periphery region according to an embodiment of the present invention.

Referring to FIG. 8, FIG. 8 illustrates a structural view of a semiconductor device according to an embodiment of the present invention. As shown in FIG. 8, it would be desirable to form the bit line structure 12 shown in FIG. 6 on the memory region 20 and at the same form another gate structure 54 on the substrate 16 on the periphery region. For instance, it would be desirable to form the TiSiN layer 40 as shown in FIG. 2 and then perform an additional treatment process to react part of the TiSiN layer 40 with $NH_3$ to form a nitrogen-rich layer 50 on the surface of the TiSiN layer 40, in which the nitrogen-rich layer 50 is essentially made of TiSiN. In other words, two TiSiN layers having different nitrogen concentrations could be formed on top of the TiN layer 30, in which the concentration of nitrogen in the TiSiN layer 40 on the bottom is preferably less than the concentration of nitrogen in the TiSiN layer (or nitrogen-rich layer 50) on the top. Structurally, in contrast to directly forming metal silicide 44 on the surface of the TiSiN layer 40 as shown in the gate structure in FIG. 7, an additional nitrogen-rich layer 50 is disposed between the TiSiN layer 40 and the metal silicide 44 in this embodiment.

Overall, the present invention first forms a Ti layer on a silicon layer during the fabrication of a bit line structure on the memory cell region or a gate structure on the periphery region and then conducts an in-situ thermal treatment process or specifically uses the temperature of the reaction chamber (preferably at around 600° C.) to form a metal silicide made of titanium silicide (TiSi) between the Ti layer and the silicon layer. Next, the Ti layer is reacted with $NH_3$ to form TiN layer on the Ti layer and the TiN layer is then reacted with DOS to form a TiSiN layer on the TiN layer. Next, the TiSiN layer could be reacted with $NH_3$ once more to form a nitrogen-rich layer on the TiSiN layer, a conductive layer and cap layer are formed on the nitrogen-rich layer, and patterning process is conducted to form a gate structure or bit line structure.

By following the aforementioned approach, the present invention is able to form a metal silicide made of TiSi without conducting extra thermal treatment process, improve interfaces between metal silicon nitride layer (such as the TiSiN layer) and adjacent layers to prevent silicon atoms from diffusing into conductive layer made of tungsten formed afterwards, and also lower the overall thickness of the metal silicon nitride layer thereby reducing overall resistance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a titanium nitride (TiN) layer on a silicon layer;
   performing a first treatment process by reacting the TiN layer with dichlorosilane (DCS) to form a titanium silicon nitride (TiSiN) layer;
   forming a conductive layer on the TiSiN layer; and
   patterning the conductive layer, the TiSiN layer, and the silicon layer to form a gate structure.

2. The method of claim 1, wherein the silicon layer comprises amorphous silicon.

3. The method of claim 1, further comprising:
   forming a titanium (Ti) layer on the silicon layer; and
   performing a second treatment process by reacting the Ti layer with ammonia ($NH_3$) to form the TiN layer.

4. The method of claim 3, further comprising forming a metal silicide between the Ti layer and the silicon layer.

5. The method of claim 4, wherein a thickness of the metal silicide is less than a thickness of the TiN layer.

6. The method of claim 4, wherein a thickness of the metal silicide is less than a thickness of the TiSiN layer.

7. The method of claim 1, wherein the gate structure comprises a gate insulating layer on the substrate.

8. A method for fabricating semiconductor device, comprising:
   forming a titanium silicon nitride (TiSiN) layer on a silicon layer;
   performing a first treatment process by reacting the TiSiN layer with ammonia ($NH_3$) to form a nitrogen-rich layer;
   forming a conductive layer on the nitrogen-rich layer; and
   patterning the conductive layer, the nitrogen-rich layer, and the silicon layer to form a gate structure.

9. The method of claim 8, wherein the silicon layer comprises amorphous silicon.

10. The method of claim 8, further comprising:
    forming a titanium (Ti) layer on the silicon layer;
    performing a second treatment process by reacting the Ti layer with ammonia ($NH_3$) to form a titanium nitride (TiN) layer; and
    performing a third treatment process by reacting the TiN layer with dichlorosilane (DCS) to form the TiSiN layer.

11. The method of claim 10, further comprising forming a metal silicide between the Ti layer and the silicon layer.

12. The method of claim 11, wherein a thickness of the metal silicide is less than a thickness of the TiN layer.

13. The method of claim 11, wherein a thickness of the metal silicide is less than a thickness of the TiSiN layer.

14. The method of claim 8, wherein the gate structure comprises a gate insulating layer on the substrate.

* * * * *